(12) United States Patent
Pino et al.

(10) Patent No.: US 8,249,838 B2
(45) Date of Patent: Aug. 21, 2012

(54) METHOD AND APPARATUS FOR MODELING MEMRISTOR DEVICES

(75) Inventors: Robinson E. Pino, Rome, NY (US); James W. Bohl, Rome, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 387 days.

(21) Appl. No.: 12/657,262

(22) Filed: Jan. 6, 2010

(65) Prior Publication Data

US 2011/0119036 A1 May 19, 2011

Related U.S. Application Data

(60) Provisional application No. 61/284,146, filed on Nov. 17, 2009.

(51) Int. Cl.
*G06F 17/10* (2006.01)
*G06F 17/50* (2006.01)
*G01D 3/02* (2006.01)
*G01R 27/00* (2006.01)
*G01R 13/00* (2006.01)
*H01L 29/76* (2006.01)

(52) U.S. Cl. .............. 703/2; 703/13; 703/14; 702/109; 702/66; 702/70; 257/213

(58) Field of Classification Search .............. 703/2, 13, 703/14; 257/41, 213; 438/14; 702/64–66, 702/70, 109
See application file for complete search history.

(56) References Cited

U.S. PATENT DOCUMENTS

| | | | | |
|---|---|---|---|---|
| 7,398,259 | B2 * | 7/2008 | Nugent | 706/33 |
| 7,763,880 | B2 * | 7/2010 | Williams | 257/8 |
| 7,924,608 | B2 * | 4/2011 | Campbell | 257/2 |
| 2008/0079029 | A1 * | 4/2008 | Williams | 257/213 |
| 2011/0017977 | A1 * | 1/2011 | Bratkovski et al. | 257/14 |
| 2011/0121359 | A1 * | 5/2011 | Yang et al. | 257/109 |

OTHER PUBLICATIONS (Chua 1971) L. Chua, "Memristor—The Missing Circuit Element," IEEE Transactions on Circuits Theory (IEEE) 18 (5) (1971) pp. 507-519.*
(Strukov 2009) Dmitri B. Strukov, Gregory S. Snider, Duncan R. Stewart and R. Stanley Williams, "The missing memristor found," Nature vol. 453 (2008) p. 80-83.*
(Williams 2008) R. Stanley Williams, "How We Found the Missing Memristor," IEEE Spectrum, vol. 45 (12) (2008) p. 28-35.*
(Chua 1976) L. Chua and S. M. Kang, "Memristive Device and Systems," Proceedings of IEEE vol. 64 (2) (1976) p. 209-223.*
(Biolek 2009) Z. Biolek, D. Biolek, V. Biolkova, "Spice Model of Memristor With Nonlinear Dopant Drift,"Radioengineering vol. 18, No. 2, Jun. 2009 p. 210-214.*
(Joglekar 2009) Yogesh N Joglekar and Stephen J Wol, "The elusive memristor: properties of basic electrical circuits," European Journal of Physics 30 (2009) p. 661-675.*
Compact Modeling and Corner Analysis of Spintronic Memristor; Yiran Chen and Xiaobin Wang; IEEE 2009 pp. 7-12.*
Kristy A. Campbell and Christopher M. Anderson, "Phase-change memory devices with stacked Ge-chalcogenide/Sn-chalogenide layers", Microelectronics Journal 38 (2007) pp. 52-59.

* cited by examiner

*Primary Examiner* — Kamini S Shah
*Assistant Examiner* — Akash Saxena
(74) *Attorney, Agent, or Firm* — Joseph A. Mancini

(57) ABSTRACT

A method and apparatus for modeling the characteristics of memristor devices. The invention provides methods and an apparatus for accurately characterizing the linear and non-linear Lissajous current-voltage behavior of actual memristor devices and incorporating such behavior into the resultant model. The invention produces a model that is adaptable to large scale memristor device simulations.

8 Claims, 7 Drawing Sheets

METHOD AND APPARATUS FOR MODELING MEMRISTOR DEVICES

PRIORITY CLAIM UNDER 35 U.S.C. §119(e)

This patent application claims the priority benefit of the filing date of a provisional application Ser. No. 61/284,146, filed in the United States Patent and Trademark Office on Nov. 17, 2009.

STATEMENT OF GOVERNMENT INTEREST

The invention described herein may be manufactured and used by or for the Government for governmental purposes without the payment of any royalty thereon.

BACKGROUND OF THE INVENTION

The memristor device postulated in 1971 by Leon Chua [1] as the fourth basic circuit element has received much attention in the research community since the publication of Strukov's 2008 paper titled "The missing memristor found" [2]. The memristor name is a contraction for memory resistor [1] because that is exactly its function: to remember its history [3]. The memristor is a two terminal passive device whose resistance state depends on its previous state and present electrical biasing conditions. And combined with transistors in a hybrid chip, memristors could radically improve the performance of digital circuits without the necessity to shrink transistors [3]. Given their two terminal structural simplicity and electronic passivity, the applications for memristor technology range from non-volatile memory, instant on computers, reconfigurable electronics and neuromorphic computing [4],[3]. According to Chua [4], the memristor behaves like a linear resistor with memory but exhibits many interesting nonlinear characteristics, and several electronic models have been presented to describe the electrical behavior of memristor devices [1],[4],[2],[5],[6]. However, given that memristor devices are not commercially available, good physical model to hardware methods have not yet been reported m the published literature. Therefore, methods for accurate memristor modeling is an impending need.

Prior Art Memristor Models

Referring to FIG. 1 depicts the typical DC electrical Lissajous I-V curve characteristic response of a memristor device measured under test with a sinusoidal input of 0.5 V volts amplitude and 100 Hz frequency. From the figure we can clearly observe that the memristor device toggles between two states: high and low conductivity. As the memristor device transitions from a low conductivity state to a high conductivity state it exhibits highly nonlinear diode-like characteristics at approximately −0.35 and 0.2 V threshold voltages, respectively. that switched the device from a low conductivity state to a high conductivity state and vice-versa. The threshold voltage analogy is used here to describe the voltage biasing region where nonlinear behavior occurs.

Referring to FIG. 2, the most basic mathematical definition of a memristor is that of a current-controlled device for circuit analysis in the generalized class of nonlinear dynamical systems called memristive systems described by the equations $$v = R(w, i)i \quad (1)$$

$$\frac{dw}{dt} = f(w, i) \quad (2)$$

where w can be a set of state variables and R and f can in general be explicit functions of time [2],[4]. For simplicity and ease of simulation, the memristor's resistance or "memristance" can be represented as a current-controlled. time-invariant, one-port device given by $$M(w) = \frac{w}{D}R_{on} + \left(1 - \frac{w}{D}\right)R_{off} \quad (3)$$

where represents the doped region of the memristor, D the total length of the memristor device, Ron the lowest rest stance state and R,rr the highest resistance state as graphically described [2].

In order to describe the velocity at which w increases. meaning the rate at which the memristor device is becoming less resistive, Equation 2 can be described as follows $$\frac{dw(t)}{dt} = u_v \frac{R_{on}}{D} i(t) \quad (4)$$

where $u_v$ is the average ion mobility for the simplest case of ohmic electronic conduction and linear ionic drift m a uniform field [2].

Utilizing Ohm's law that states that the voltage across a resistor is directly proportional to the resistance times the current through the conductor; we can obtain from equations (3) and (4) the following relationship $$w(t) = u_v \frac{R_{on}}{D} q(t) \quad (5)$$

and by inserting Equation (5) into Equation (3), we can obtain the memristance of the system, which for an $R_{on}$ much less than $R_{off}$ can be simplified to $$M(q) = R_{off}\left(1 - u_v \frac{R_{on}}{D} q(t)\right) \quad (6)$$

[2]. Equation (6) describes the memristance of the memristor system as a function of the charge q(t).

Additional improvements have been proposed to the aforementioned memristor model to include of non-linear boundary conditions [5],[6]. The non-linear boundary condition proposed is of the form $$f_p(w) = 1 - \left(2\frac{w}{D} - 1\right)^{2p} \quad (7)$$

The nonlinear window function in Equation (7) guarantees zero velocity of the doped/undoped barrier interface described in FIG. 1 as w approaches either boundary, w=0 or w=D. Moreover, the differences between the models with linear and nonlinear drift disappear when p increases [5]. The incorporation of the window' function described by Equation (7) requires the redefining of Equation (4) as follows $$\frac{dw(t)}{dt} = u_v \frac{R_{on}}{D} i(t) f_p(w) \quad (8)$$

for p=1, it is possible to integrate equation (8) analytically; however, for values of p larger than 1 only numerical solutions are possible [6].

Failure of Prior Art Linear and Non-Linear Memristor Models

Attempts have been made to perform a model fit utilizing both the linear [2] and nonlinear [5],[6] memristor models. Referring to FIG. 3 shows prior art memristor model to hardware correlation fit utilizing the memristor linear model [2]. From the figure, we can observe that the linear model does not accurately capture the high memristor nonlinearities located at approximately the −0.35 and 0.2 V threshold voltages. In particular, and still referring to FIG. 3, there appear to be two regions of memristor operation between −0.35 to −0.05 V and between 0.05 and 0.2 V which the linear memristor model fails to model accurately. FIG. 4 describes the theoretical I-V curves for a memristor device with (realistic) dopant drift modeled by window functions obtained by Joglekar et. al [6]. From the figure, it is clear that the prior art nonlinear model results do not accurately describe the actual DC electrical Lissajous I-V characteristic behavior of physical memristor device hardware.

OBJECTS AND SUMMARY OF THE INVENTION

The present invention provides a method and apparatus to generate models for memristor devices.

It is an object of the present invention to provide accurate memristor device models that replicate both the linear and non-linear resistance characteristics of actual memristors.

It is another object of the present invention, then, to provide a method and apparatus for identifying memristor transition regions from high resistance to low resistance and then to generate curve fitting parameters that replicate these transition regions in the resultant model.

Briefly stated, the present invention provides a method and apparatus for modeling the characteristics of memristor devices. The invention provides methods and an apparatus for accurately characterizing the linear and non-linear Lissajous current-voltage behavior of actual memristor devices and incorporating such behavior into the resultant model. The invention produces a model that is adaptable to large scale memristor device simulations.

The above, and other objects, features and advantages of the present invention will become apparent from the following description read in conjunction with the accompanying drawings in which like reference numerals designate the same elements.

INCORPORATED BY REFERENCE

[1] (Chua 1971) L. Chua, "Memristor—The Missing Circuit Element," IEEE Transactions 10 on Circuits Theory (IEEE) 18 {5} {1971} 507-519.
[2] (Strukov 2009) Dmitri B. Strukov. Gregory S. Snider. Duncan R. Stewart and R. Stanley Williams, "The missing memristor found,"; Nature vol 453 (2008) p 80-83.
[3] (Williams 2008) R. Stanley Williams, "How We Found the Missing Memristor," IEEE Spectrum, vol 45 (12) (2008) p 28-35.
[4] (Chua 1976) L. Chua and S. M. Kang. "Memristive Device and Systems," Proceedings of IEEE Vol 64 (2) (1976) p 209-:223.
[5] (Biolek 2009) Z. Bialek, D. Biolek, V. Biolkova, "Spice Model of Memristor With Nonlinear Dopant Drift," Radioengineering Vol. 18. No. 2, June 2009 P 210-214.
[6] (Joglekar 2009) Yogesh N Joglekar and Stephen J Wol, "The elusive memristor: properties of basic electrical circuits." European Journal of Physics 30 {2009} 661-675.
[7] (Campbell 2009) Kristy A. Campbell, Christopher M. Anderson, "Phase-change memory devices with stacked Ge-chalcogenide/Sn-chalcogenide layers," Microelectronics Journal Vol 38 (1) (2007) Pages 52-59.

DETAILED DESCRIPTION OF THE PREFERRED EMBODIMENT

Figure 1:
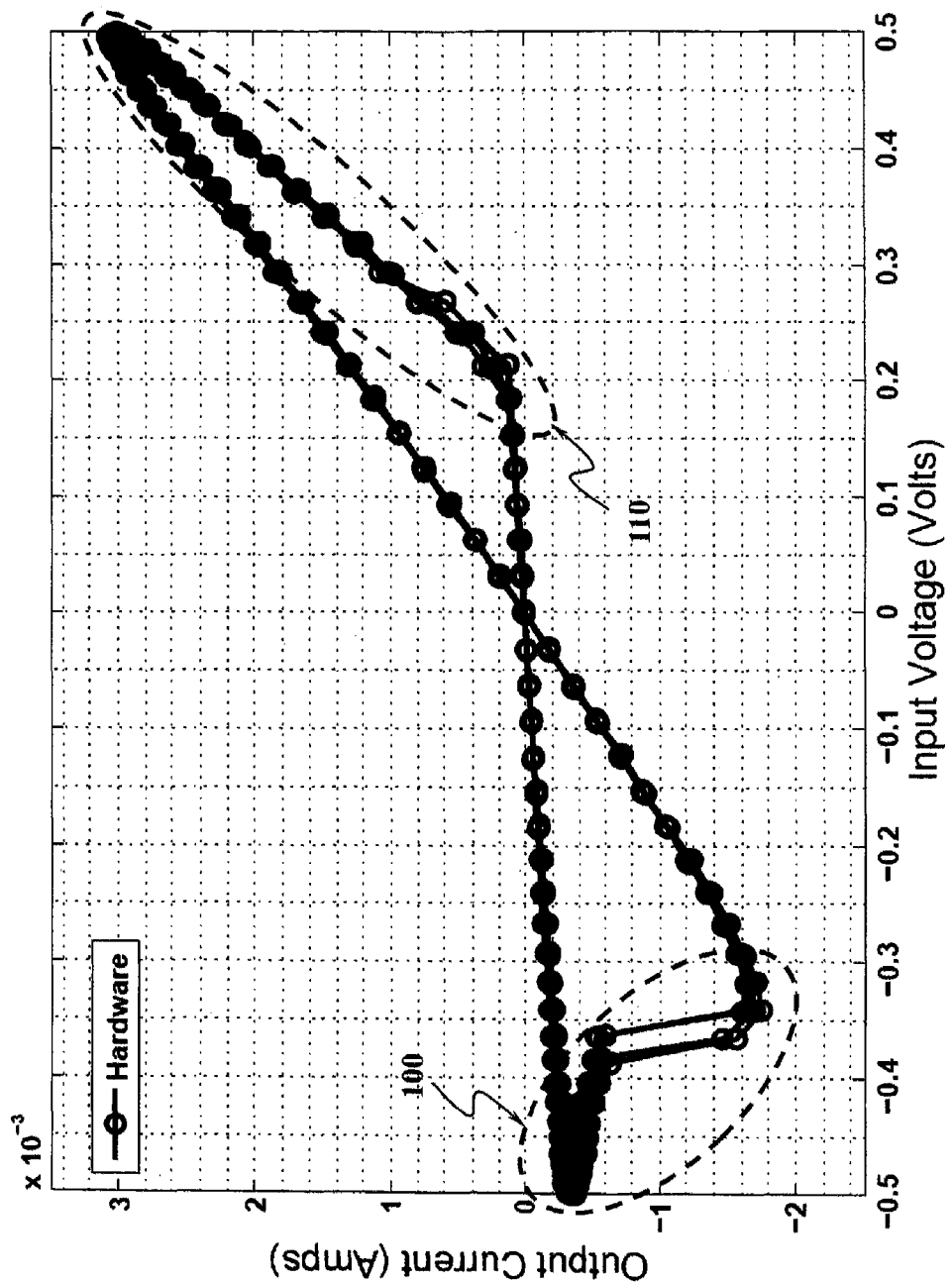
FIG. 1 depicts typical memristor device DC electrical Lissajous I-V curve characteristic behavior.
Figure 2:
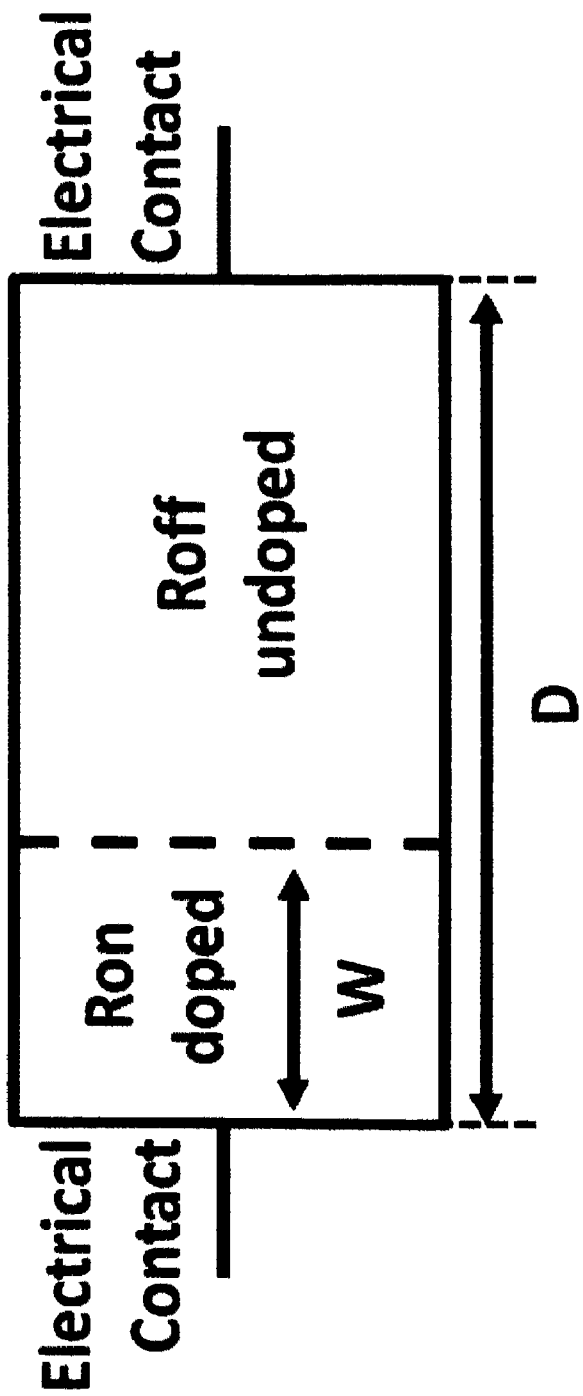
FIG. 2 depicts a memristor device physical structural diagram.

The present invention provides a method for modeling memristor electrical characterstics which correlate accurately with actual memristor hardware behavior. Over the course of developing the present invention attempts were made to fit linear and nonlinear models to fit memristor hardware with little success, primarily because these prior art published models don't represent accurately the electrical characteristic behavior of memristor dence hardware. Therefore, the present invention developed the steps for achieving a compact model that accurately represents the electrical behavior of chalcogenide based memristors. The models produced by the present invention consists of a threshold memristor model similar to those utilized in state of the art CMOS modeling and simulation as for example the well known BSIM4.6.4 from the University of California, Berkeley. These types of compact models have proven very valuable within the microelectronics industry given their straight forward singled valued mathematical formulations that make modeling and simulation within very large scale integrated circuits fast, reliable and accurate. Common CMOS transistors operate within various regions of operation, cutoff, ohmic and saturation. Similarly. the present invention provided a method for developing a memristor model that operates within three regions: off, nonlinear and on. Therefore, the goal of the present invention is to develop a compact memristor model that describes the electrical behavior of memristor devices, and it is simple and accurate to enable large scale device simulations.

Measured Results on Memristors

All hardware memristor devices which were measured as the basis for development of the present invention modeling were fabricated and tested at Boise State University, and the fabrication details have been described elsewhere [7]. The physical structure of the memristor devices characterized was composed of three thin films of Ag, SnSe and Ge2Se3 sandwiched between tungsten metal contacts. All electrical DC measurements were performed with an Agilent B 1500A (HP4145B) semiconductor parameter analyzer and Micromanipulator 6200 microprobe station equipped with temperature controllable wafer chuck and tungsten probe W tips (Micromanipulator size 7A) at room temperature. The tested memristor devices were 180 nm in diameter with 80 um×80 um tungsten pads for electrical contact to the top and bottom electrodes. All of the electrical measurements performed and recorded (see FIG. 7, 210) by the semiconductor parameter analyzer can be input to a computer over a standard data bus in real time, or stored onto other recording media or removable memory device for further processing by specialized modeling software which prescribes the necessary computer executed steps. The specialized software will generate a model corresponding to the measured and recorded parameters of the particular memristor under test. Of course, models corresponding to the recorded measured parameters can be either automatically or manually plotted (see FIG. 7, 220).

Figure 3:
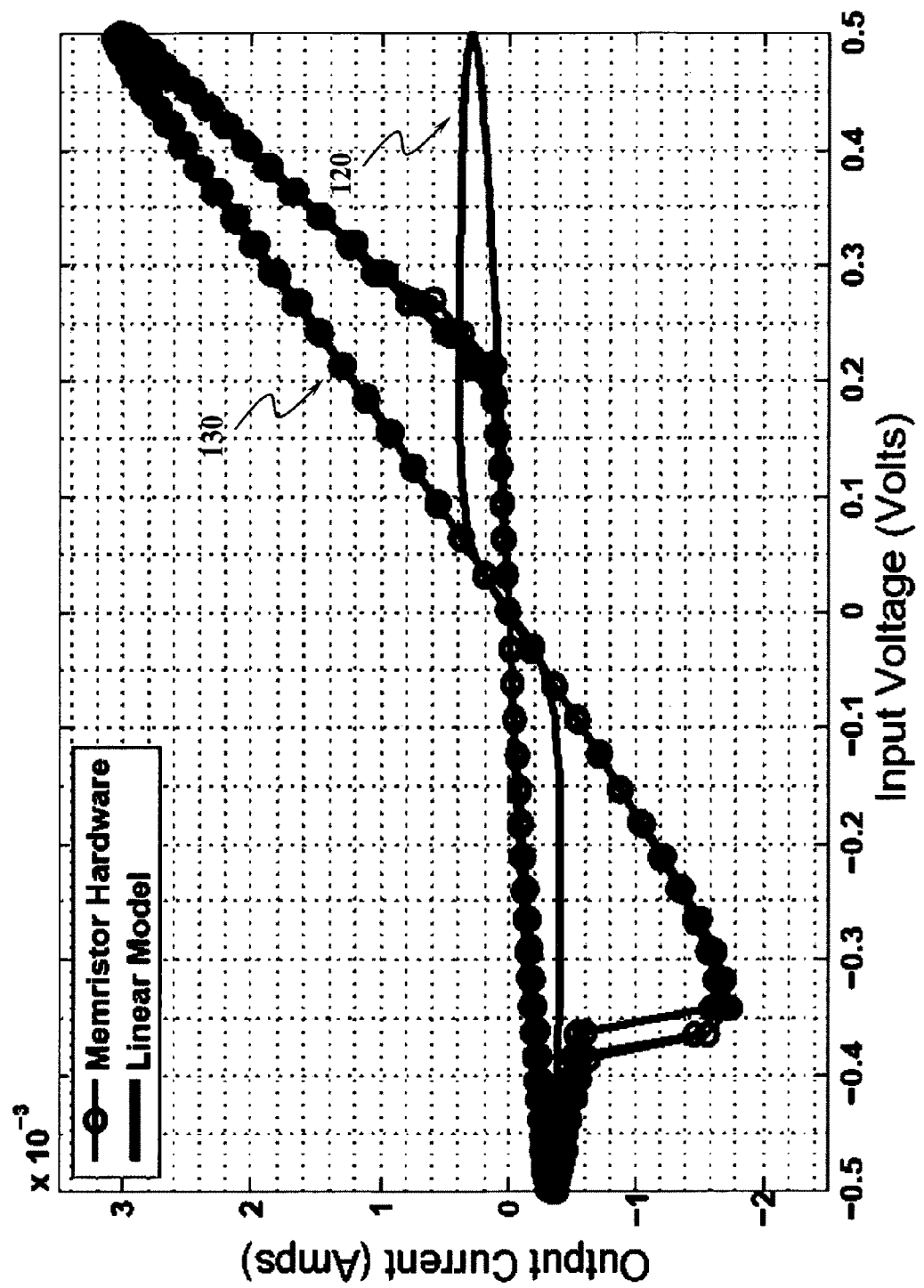
FIG. 3 depicts prior art memristor hardware and model fit correlation between measured results and the linear memristor model.
Figure 4:
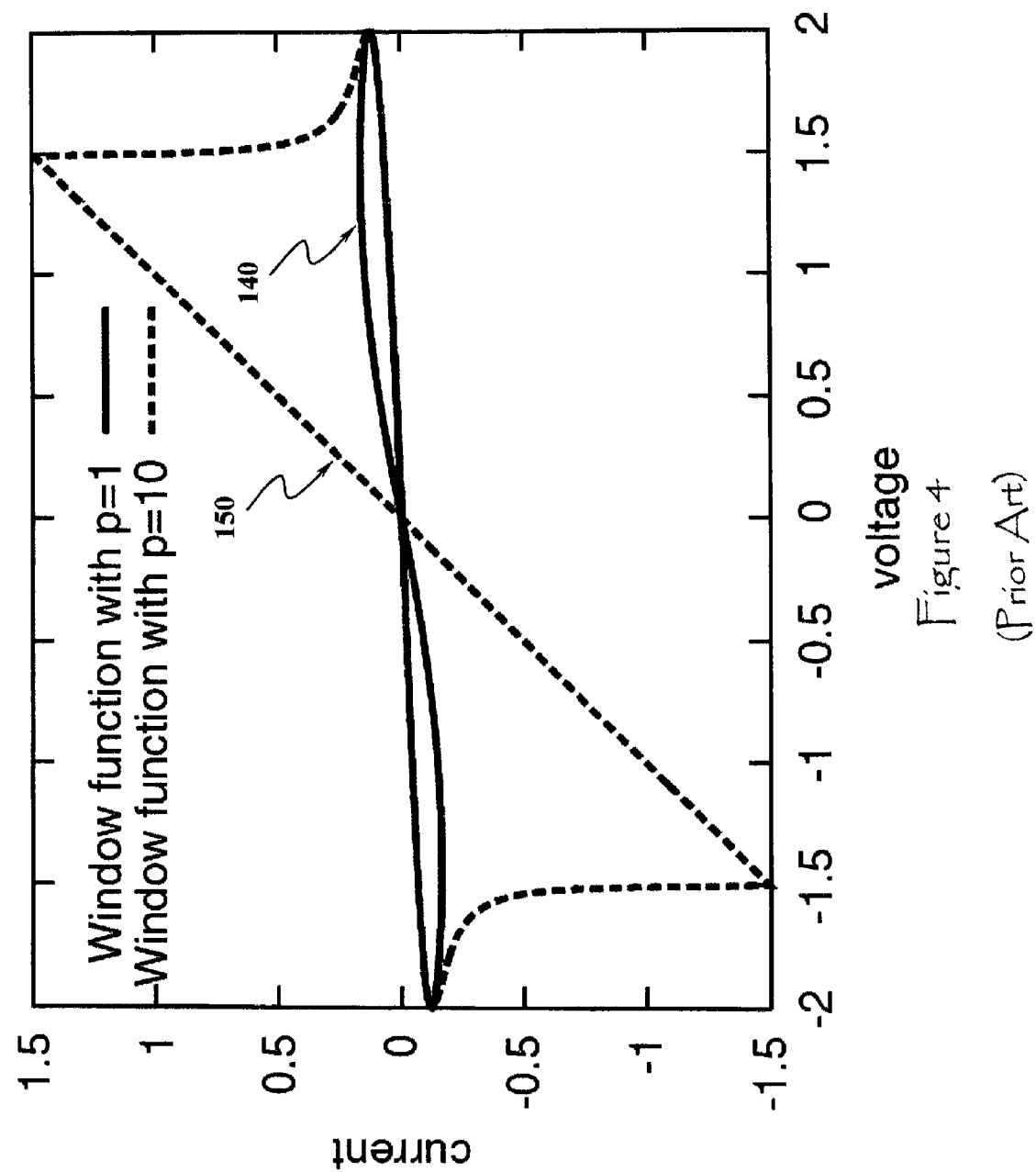
FIG. 4 depicts prior art theoretical i-v curves for a memristor with (realistic) dopant drift modeled by window functions.

For nonlinear modeling, if one considers the actual memristor regions of operation where the nonlinear behavior dominates below or above the threshold voltages, −0.35 and 0.2 V respectively (see 100, 110, FIG. 1), prior art models (see 120, FIG. 3) do not replicate measure hardware (see 130, FIG. 3) for either p=1 and p=10 (see 140, 150, FIG. 4). Given the lack of measured and model correlation for both linear and nonlinear memristor prior art models, the present invention has developed an empirical memristor modeling method that can be employed to accurately capture the DC electrical Lissajous I-V curve characteristic behavior of memristor devices.

Figure 7:
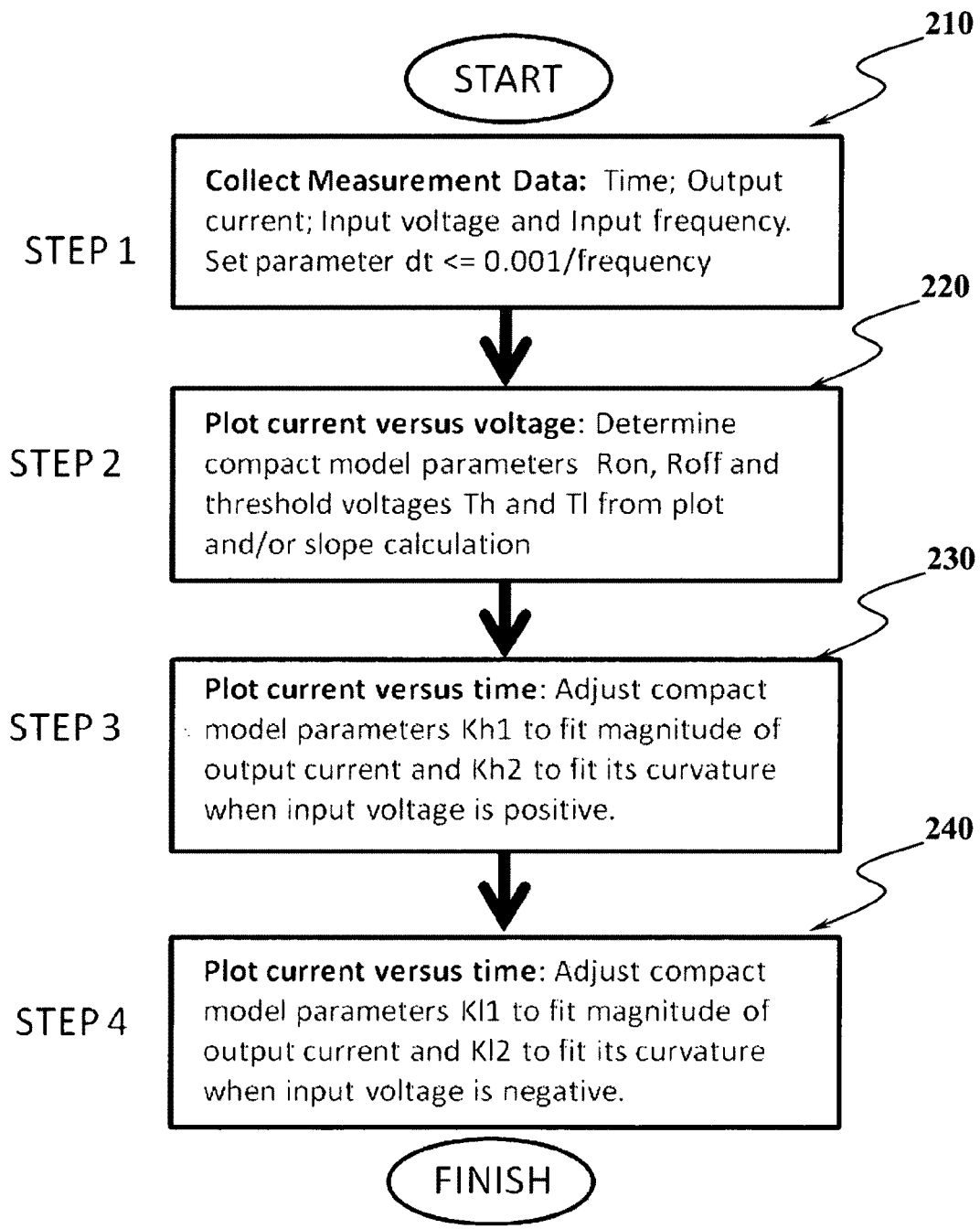
FIG. 7 depicts the present invention method steps for modeling memristor devices.

Referring to FIG. 7, one important characteristic of memristor devices is the fact that their present behavior is dependent on their past state. Therefore, the present invention models electronic characteristic behavior as being dependent on the previous memristor state requiring the need for determining a set of initial conditions. For example, $R_{mem}$ (t=T) represents the state or the memristor device at an initial time T. $R_{on}$ and $R_{off}$ must be determined (see FIG. 7, 220) as they represent final states of the memristor device. Assuming that the memristor device initial state corresponds to $R_{mem}$ (t=0)= $R_{on}$ and that in time an input potential voltage greater than $T_h$ (see FIG. 7, 220) is present across the device and which is also a parameter requiring determination, the present invention models the behavior of the memristor device as follows $$R_{mem}(t) = R_{mem}(t - \Delta t) - \Delta t K_{h1} e^{K_{h2}(V_{in}(t) - T_h)} \{ \text{if } R_{mem}(t) < R_{on} \} \quad (9)$$

$$R_{mem}(t) = R_{on} \{ \text{if } R_{mem}(t) \geq R_{on} \}$$

Where Δt=1e-3/f corresponds to the minimum integral time step between memresistance observations, f is the frequency of the sinusoidal input voltage, $T_h$ corresponds to the threshold voltage required to enter the nonlinear region from the off region, and $K_{h1}$ and $K_{h2}$ correspond to fitting parameters use to capture the nonlinear effects (see 160, FIG. 5, see also 180, FIG. 6) characteristic of the memristor device. $K_{h1}$ and $K_{h2}$ must be determined for correct model fit. {see FIG. 7, 230)

On the other hand, if an input potential voltage lower than $T_1$ is present across the Device, the present invention models the behavior of the memristor device as follows:

$$R_{mem}(t) = R_{mem}(t - \Delta t) - \Delta t K_{l1} e^{K_{l2}(V_{in}(t) - T_l)} \{ \text{if } R_{mem}(t) > R_{off} \} \quad (10)$$

$$R_{mem}(t) = R_{off} \{ \text{if } R_{mem}(t) \leq R_{off} \}$$

where $T_1$ corresponds to the threshold voltage required to enter the nonlinear region from the on region, $K_{l1}$ and $K_{l2}$ correspond to fitting parameters to capture the nonlinear effects (see 170, FIG. 5, see also 190, FIG. 6) characteristic of the memristor device. $K_{l1}$ and $K_{l2}$ must be determined for correct model fit. (see FIG. 7, 240)

Figure 5:
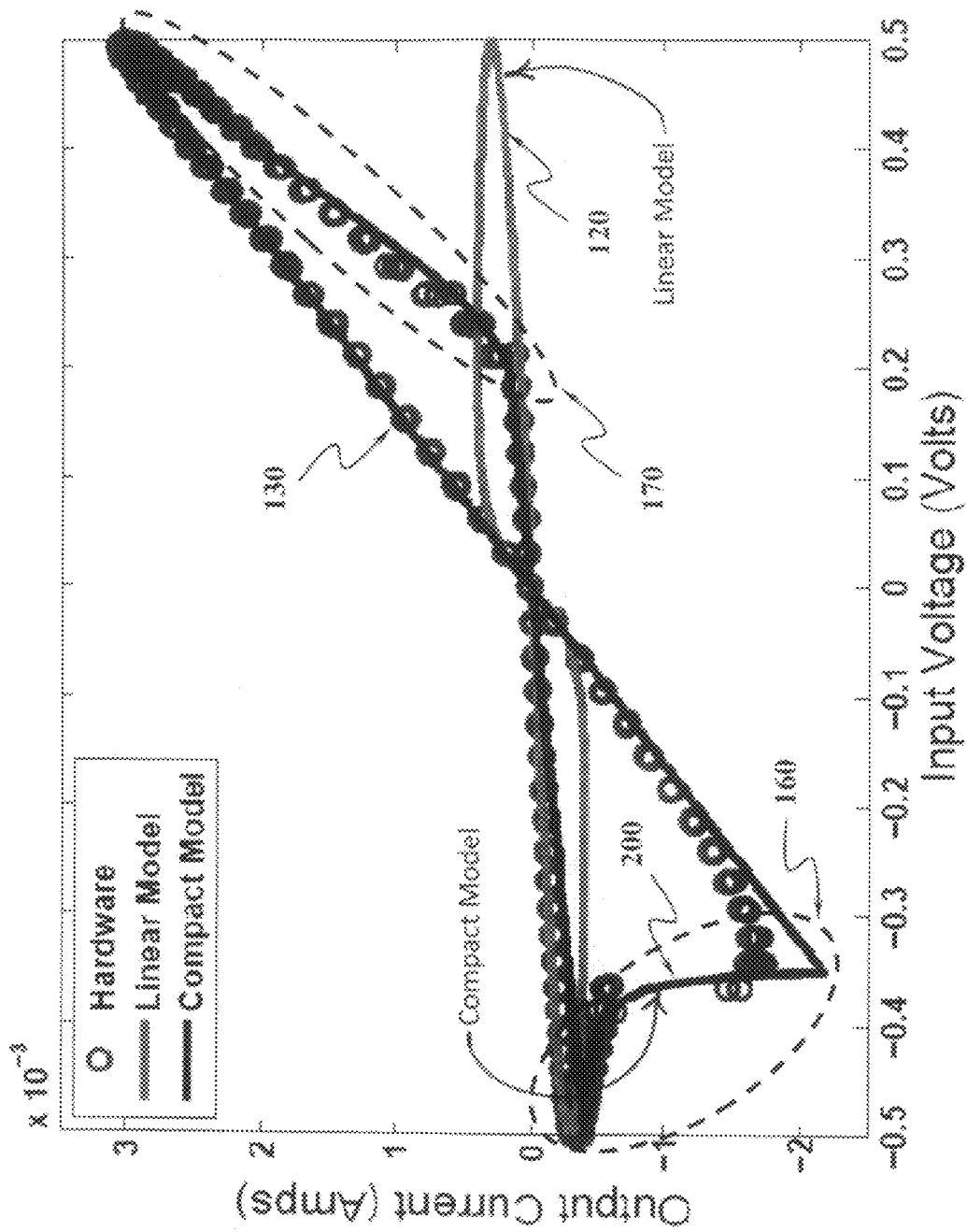
FIG. 5 depicts memristor hardware to model correlation for the linear and compact memristor models.
Figure 6:
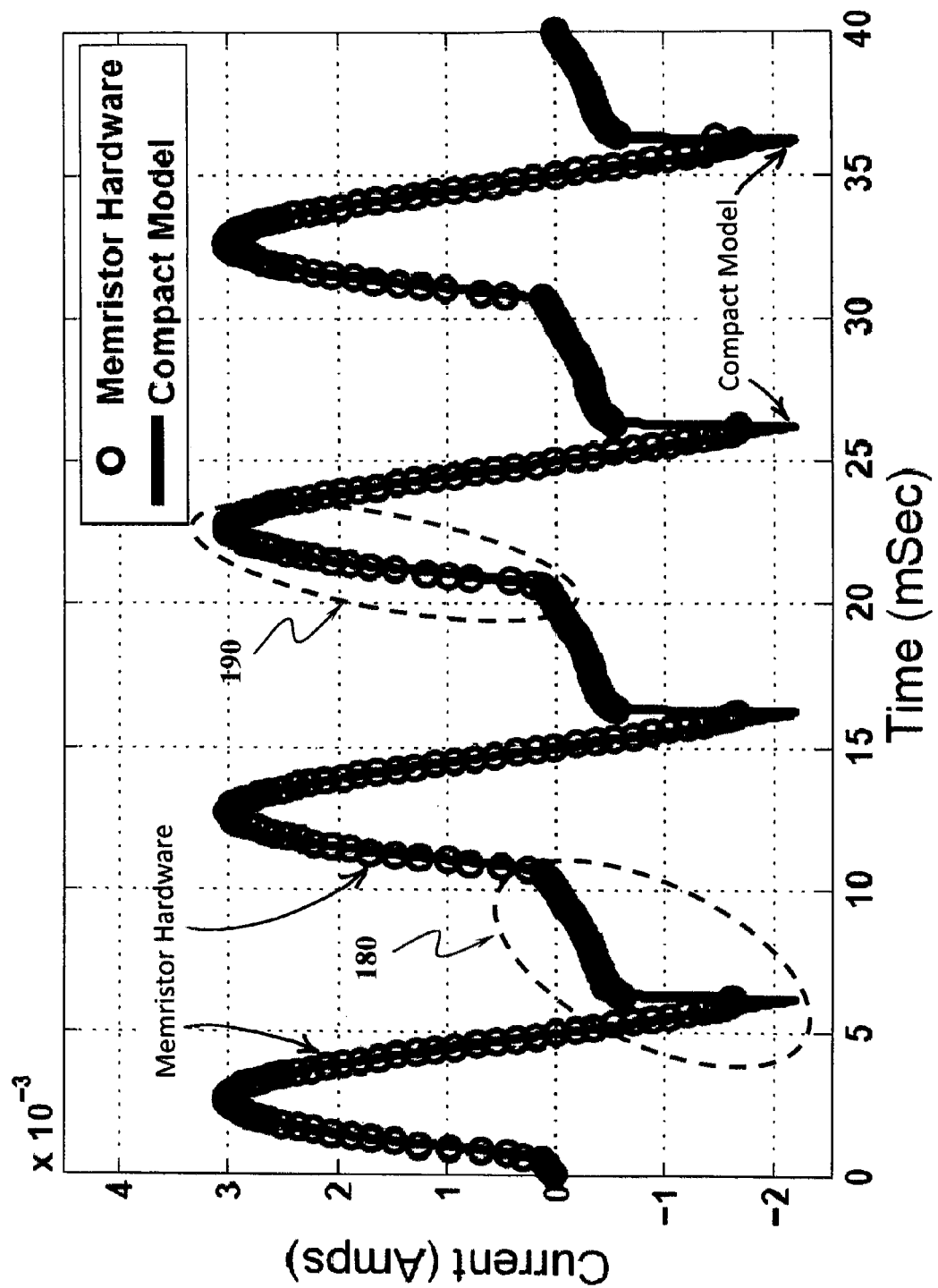
FIG. 6 depicts memristor hardware to compact model correlation as function of time.

Otherwise, the state of the memristor device remains unchanged, and therefore the present state of the memristor equals that of its previous resistance state, the present invention sets $R_{mem}(t)=R_{mem}(t-\Delta t)$. It is important to highlight the diode like behavior exhibited by memristor devices driven by their internal highly nonlinear transport process. In fact, a closer examination of equations (9) and (10) will reveal that the model produced by the present invention resembles that of semiconductor diode devices which provided the inspiration to develop the present invention's method for modeling memristors. Referring to FIG. 5 describes the memristor hardware electrical characterization results to the model fit for the prior art linear memristor model and the memristor models produced by the present invention. From FIG. 5, one can observe that the present invention's model 200 is able to describe all regions 130 of DC electrical operation of the memristor device including the high and low conductivity regions and the nonlinear regions 160, 170. The present invention's model fitting parameters which achieve the model fit displayed in FIG. 5 correspond to $R_{on}$=160, $R_{off}$=1200, $T_h$=0.2, $T_1$=−0.35, $K_{h1}$=5.e6, $K_{h2}$=−20, $K_{l1}$=4e6, $K_{l2}$=20, an input sinusoidal voltage of 0.5 V amplitude and 100 Hz frequency and the initial condition that the state of the memristor=$R_{off}$. Referring to FIG. 6 displays the present invention's time dependent model results versus the measured results for the memristor device hardware showing a good model to hardware correlation in the time domain, inclusive of nonlinear voltage versus current regions (see FIG. 5, 170, 160) being depicted here in the corresponding regions 180. 190 of a current versus time plot.

Having described preferred embodiments of the invention with reference to the accompanying drawings, it is to be understood that the invention is not limited to those precise embodiments, and that various changes and modifications may be effected therein by one skilled m the art without departing from the scope or spirit of the invention as defined in the appended claims.

What is claimed is:

1. A method for producing a model of a memristor device for facilitating integrated circuit modeling and simulation, comprising the steps of:
    inputting a periodic signal into a memristor, said periodic signal having a minimum voltage amplitude, a maximum voltage amplitude, and a frequency;
    measuring and recording said memristor's output current at a plurality of
    discrete time intervals over at least one period of said periodic signal;
    plotting said output current versus input voltage over said at least one time period of said periodic signal;
    plotting said output current versus time over said at least one time period of said periodic signal;
    determining a high resistance state $R_{on}$ of said memristor from the slope of a high resistance portion of said plotted output current versus said input voltage;

determining a low resistance state $R_{off}$ of said memristor from the slope of a low resistance portion of said plotted output current versus said input voltage;

determining, from said plotted output current versus said input voltage a low threshold voltage $T_l$ at which said memristor transitions from a high resistance state to a low resistance state, and a high threshold voltage $T_h$ at which said memristor transitions from a low resistance state to a high resistance state;

determining from said plot of output current versus time a value of a magnitude fitting parameter $K_{h1}$ when said input voltage is positive;

determining from said plot of output current versus time a value of a curvature fitting parameter $K_{h2}$ when said input voltage is positive;

determining from said plot of output current versus time a value of a magnitude fitting parameter $K_{l1}$ when said input voltage is negative;

determining from said plot of output current versus time a value of a curvature fitting parameter $K_{l2}$ when said input voltage is negative; and WHEN input voltage $V_{in}$ is greater than said high threshold voltage $T_h$, THEN generating a model of said memristor device according to the expression $$R_{mem}(t) = R_{mem}(t - \Delta t) - \Delta t K_{h1} e^{K_{h2}(V_{in}(t) - T_h)} \begin{cases} \text{if } R_{mem}(t) < R_{on} \\ \text{else } R_{mem}(t) = R_{on} \end{cases}$$

WHEN input voltage $V_{in}$ is less than said low threshold voltage $T_l$,

THEN generating a model of said memristor device according to the expression $$R_{mem}(t) = R_{mem}(t - \Delta t) - \Delta t K_{l1} e^{K_{l2}(V_{in}(t) - T_l)} \begin{cases} \text{if } R_{mem}(t) > R_{off} \\ \text{else } R_{mem}(t) = R_{off} \end{cases}$$

where $R_{mem}(t)$ is the resistance of said memristor at time t;
$R_{mem}(t-\Delta t)$ is the resistance of said memristor at time $t-\Delta t$:
$R_{on}$ is the resistance of said memristor in its high resistance state;
$R_{off}$ is the resistance of the memristor in its low resistance state;
$V_{in}$ is the voltage input to the memristor;
$T_l$ is the low threshold voltage of said memristor;
$T_h$ is the high threshold voltage of said memristor:
$K_{h1}$ is the magnitude fitting parameter when said input voltage is positive;
$K_{h2}$ is the curvature fitting parameter when said input voltage is positive;
$K_{l1}$ is the magnitude fitting parameter when said input voltage is negative;
$K_{l2}$ is the curvature fitting parameter when said input voltage is negative; and
$\Delta t$ is the minimum integral time step parameter between successive memristor resistance measurements.

2. The method of claim 1, wherein said plurality of discrete time intervals comprises at least 1000 discrete time intervals.

3. The method of claim 1 wherein $\Delta t$ is 0.001 times said frequency or said input signal.

4. An apparatus for producing a model of a memristor device for facilitating integrated circuit modeling and simulation, comprising;

a fixture for applying a voltage across a memristor;
voltage measuring and recording means;
a current measuring and recording means;
a time measuring and recording means;
a computer having an external data bus,
   wherein said computer receives said voltage, current, and time recorded measurements over said external data bus;
a software program;
   wherein said software program further comprises computer executable instructions which, when said instructions are executed by said computer, said instructions perform the steps of:

inputting a periodic signal into a memristor, said periodic signal having a minimum voltage amplitude, a maximum voltage amplitude, and a frequency;

measuring and recording said memristor's output current at a plurality of discrete time intervals over at least one period of said periodic signal;

plotting said output current versus input voltage over said at least one time period of said periodic signal;

plotting said output current versus time over said at least one time period of said periodic signal;

determining a high resistance state $R_{on}$ of said memristor from the slope of a high resistance portion of said plotted output current versus said input voltage;

determining a low resistance state $R_{off}$ of said memristor from the slope of a low resistance portion of said plotted output current versus said input voltage;

determining, from said plotted output current versus said input voltage a low threshold voltage $T_l$ at which said memristor transitions from a high resistance state to a low resistance state, and a high threshold voltage $T_h$ at which said memristor transitions from a low resistance state to a high resistance state;

determining from said plot of output current versus time a value of a magnitude fitting parameter $K_{h1}$ when said input voltage is positive;

determining from said plot of output current versus time a value of a curvature fitting parameter $K_{h2}$ when said input voltage is positive;

determining from said plot of output current versus time a value of a magnitude fitting parameter $K_{l1}$ when said input voltage is negative;

determining from said plot of output current versus time a value of a curvature fitting parameter $K_{l2}$ when said input voltage is negative; and WHEN input voltage $V_{in}$ is greater than said high threshold voltage $T_h$, THEN generating a model of said memristor device according to the expression $$R_{mem}(t) = R_{mem}(t - \Delta t) - \Delta t K_{h1} e^{K_{h2}(V_{in}(t) - T_h)} \begin{cases} \text{if } R_{mem}(t) < R_{on} \\ \text{else } R_{mem}(t) = R_{on} \end{cases}$$

WHEN input voltage $V_{in}$ is less than said low threshold voltage $T_l$,

THEN generating a model of said memristor device according to the expression $$R_{mem}(t) = R_{mem}(t - \Delta t) - \Delta t K_{l1} e^{K_{l2}(V_{in}(t) - T_l)} \begin{cases} \text{if } R_{mem}(t) > R_{\textit{off}} \\ \text{else } R_{mem}(t) = R_{\textit{off}} \end{cases}$$

where $R_{mem}(t)$ is the resistance of said memristor at time t;
$R_{mem}(t-\Delta t)$ is the resistance of said memristor at time $t-\Delta t$:
$R_{on}$ is the resistance of said memristor in its high resistance state;
$R_{\textit{off}}$ is the resistance of the memristor in its low resistance state;
$V_{in}$ is the voltage input to the memristor;
$T_1$ is the low threshold voltage of said memristor;
$T_h$ is the high threshold voltage of said memristor:
$K_{h1}$ is the magnitude fitting parameter when said input voltage is positive;
$K_{h2}$ is the curvature fitting parameter when said input voltage is positive;
$K_{l1}$ is the magnitude fitting parameter when said input voltage is negative;
$K_{l2}$ is the curvature fitting parameter when said input voltage is negative; and
$\Delta t$ is the minimum integral time step parameter between successive memristor resistance measurements.

5. The apparatus of claim 4, wherein said plurality of discrete time intervals comprises at least 1000 discrete time intervals.

6. Apparatus of claim 4, wherein said voltage, current, and time measuring and recording means comprise a semiconductor parameter analyzer.

7. Apparatus of claim 4, wherein said fixture for applying a voltage across a memristor comprises a microprobe station.

8. Apparatus of claim 4 wherein $\Delta t$ is 0.001 times said frequency of said input signal.

\* \* \* \* \*